(12) United States Patent
Kominato et al.

(10) Patent No.: US 7,655,364 B2
(45) Date of Patent: Feb. 2, 2010

(54) METHODS OF MANUFACTURING MASK BLANK AND TRANSFER MASK

(75) Inventors: Atsushi Kominato, Shinjuku-ku (JP); Toshiyuki Suzuki, Shinjuku-ku (JP); Yasushi Okubo, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 12/264,424

(22) Filed: Nov. 4, 2008

(65) Prior Publication Data

US 2009/0117474 A1 May 7, 2009

(30) Foreign Application Priority Data

Nov. 5, 2007 (JP) .............................. 2007-287272

(51) Int. Cl.
*G03F 9/00* (2006.01)

(52) U.S. Cl. ............................ 430/5; 430/296; 430/942

(58) Field of Classification Search ...................... 430/5, 430/296, 942
See application file for complete search history.

(56) References Cited

U.S. PATENT DOCUMENTS

| 6,762,000 B2 * | 7/2004 | Nozawa et al. ................. 430/5 |
| 2002/0110741 A1 | 8/2002 | Nozawa et al. |

FOREIGN PATENT DOCUMENTS

| JP | 08-137089 A | 5/1996 |
| JP | 2002-090977 A | 3/2002 |
| JP | 2006-184353 A | 7/2006 |

\* cited by examiner

*Primary Examiner*—Christopher G Young
(74) *Attorney, Agent, or Firm*—Sughrue Mion, PLLC

(57) ABSTRACT

In a method of manufacturing a mask blank adapted to be formed with a resist pattern by electron beam writing and having a light-shielding film and an etching mask film of an inorganic-based material resistant to etching of the light-shielding film which are formed in this order on a transparent substrate, when forming the etching mask film, shielding is performed using a shielding plate so as to prevent the etching mask film from being formed at least at a side surface of the substrate.

7 Claims, 2 Drawing Sheets

US 7,655,364 B2

METHODS OF MANUFACTURING MASK BLANK AND TRANSFER MASK

This application is based upon and claims the benefit of priority from Japanese patent application JP 2007-287272, filed on Nov. 5, 2007, the disclosure of which is incorporated herein in its entirety by reference.

TECHNICAL FIELD

This invention relates to methods of manufacturing a mask blank and a transfer mask for use in manufacturing semiconductor devices, display devices (display panels), or the like.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, use has been made of photomasks applied with the resolution enhancement technology (RET) such as the phase shift technique. A phase shift mask is a photomask that can improve the resolution of a transfer pattern using interference of light caused by a phase shifter.

Normally, the photolithography is performed by reduced projection exposure in microprocessing of a semiconductor substrate and a pattern of a transfer mask has a size about four times that of a pattern to be formed on the semiconductor substrate. However, in the photolithography according to the semiconductor design rule of DRAM half-pitch (hp) 45 nm and onward, the size of a circuit pattern on a mask is smaller than a wavelength of exposure light. Therefore, if a transfer mask formed with a transfer pattern according to the circuit pattern design is used to carry out reduced projection exposure, a shape in conformity with the transfer pattern cannot be transferred onto a resist film on a semiconductor substrate due to the influence of exposure light interference or the like.

Under these circumstances, as a mask employing the resolution enhancement technology, use is made of an OPC mask or the like applied with a technique of correcting an optical proximity effect, which degrades the transfer characteristics, by performing optical proximity effect correction (OPC) (Japanese Unexamined Patent Application Publication (JP-A) No. H08-137089: Patent Document 1). For example, it is necessary to form on an OPC mask an OPC pattern (e.g. an assist bar or a hammer head of a line width less than 100 nm) having a size half or less of that of a circuit pattern.

SUMMARY OF THE INVENTION

For forming a fine pattern according to the semiconductor design rule of DRAM half-pitch (hp) 45 nm and onward, it is necessary to use high-NA (hyper-NA) exposure with a numerical aperture NA>1, for example, immersion exposure.

The immersion exposure is an exposure method that can improve the resolution by filling a liquid between a wafer and a lowermost lens of an exposure apparatus so that the numerical aperture is increased by the refractive index of the liquid times as compared with that in the case of air whose refractive index is 1. The numerical aperture is given by NA=n×sin θ, where θ represents an angle formed between a light ray incident on the lowermost lens of the exposure apparatus at its outermost portion and the optical axis and n represents a refractive index of a medium between a wafer and the lowermost lens of the exposure apparatus.

However, it has been found that there is a problem in that the expected CD accuracy cannot be obtained by employing the immersion exposure with NA>1 to form a fine pattern according to the semiconductor design rule of DRAM half-pitch (hp) 45 nm (hereinafter referred to as "hp45 nm") and onward.

As one of its causes, there is an influence of mask blank charge-up which will be described hereinbelow.

Following the mask pattern miniaturization, the requirement for mask fabrication accuracy has also been getting stricter.

Particularly in the case of the hp45 nm and onward, following further mask pattern miniaturization, the requirement for mask fabrication accuracy will also be much stricter to make the mask fabrication difficult. As one of factors that determine the mask fabrication accuracy, the resist resolution is cited. In resist pattern formation in mask fabrication according to the hp45 nm and onward, electron beam (EB) writing capable of highly accurate writing is carried out because patterns are miniaturized and complicated. In the resist pattern formation using the EB writing, a problem of charge-up is raised (see Patent Document 1). The problem is that, during EB writing of a resist pattern, a film underlying a resist is charged up and affects the resolution of the resist. In the EB writing, a measure such as reducing the surface resistance of a mask blank is necessary for preventing the charge-up.

The layer structure of a general mask blank is a laminate of substrate/light-shielding film/resist and grounding from the mask blank set on a stage of an EB writing apparatus is normally performed at a side surface or a chamfered surface of the substrate (which of the surfaces is used for grounding depends on the type of writing apparatus). For efficient grounding, the structure at end surfaces of the substrate (representing side surfaces and chamfered surfaces of the substrate; the same shall apply hereinafter) is such that the Cr film (light-shielding film) is formed down to the side surfaces of the substrate (see FIG. 1) and the resist at the side surfaces and the chamfered surfaces of the substrate is removed (see Japanese Unexamined Patent Application Publication (JP-A) No. 2006-184353 Patent Document 2).

On the other hand, the layer structure of a mask blank with an etching mask (also called a hard mask) film is, for example, a laminate of substrate/halftone film/Cr film/etching mask film/resist. If the etching mask film covers the Cr film at side surfaces or chamfered surfaces of the substrate, since the surface resistance (sheet resistance) of the etching mask film is greater than that of the Cr film, the surface of the etching mask film is charged up during EB writing to increase influence on the resolution of the resist, thus disturbing fine patterning. Therefore, the controllability of pattern processing is reduced. Accordingly, for suppressing the charge-up, during the EB writing, of the etching mask film for use in forming a mask having a fine pattern according to the hp45 nm and onward, there is required a measure for efficiently grounding the mask blank on a stage of an EB writing apparatus.

For efficiently grounding the mask blank on the stage of the EB writing apparatus, it may be considered to increase the exposed area of the Cr film by preventing the etching mask film from being formed in a grounding region (side surfaces or chamfered surfaces of the substrate), i.e. by preventing the etching mask film from being formed at the end surfaces (side surfaces or chamfered surfaces) of the substrate.

However, for example, if use is made of a shielding plate illustrated in FIG. 2 of Japanese Unexamined Patent Application Publication (JP-A) No. 2002-90977 (Patent Document 3), it is necessary to cover the main surface of the substrate to some extent with the shielding plate in order to prevent a film forming material from reaching the end surfaces (side surfaces or chamfered surfaces) of the substrate to form the etching mask film at those surfaces. Accordingly, the film forming region of the etching mask film is narrowed. Then, there arises another problem that since there is a region formed with no etching mask film at the peripheral portion of the main surface, a pattern cannot be formed in such a region. Specifically, as illustrated in FIG. 2, an alignment mark 5 for use in setting a mask in a wafer exposure apparatus (stepper) is formed at the peripheral portion of the main surface of a substrate 1. There is a problem that if an etching mask film 3 is not formed at the peripheral portion of the main surface of the substrate 1, a lack occurs in the alignment mark 5 formed by a light-shielding film 2 and, if this lack in alignment mark pattern is significant, the mask cannot be set in the exposure apparatus. For preventing the occurrence of the lack in the alignment mark 5, it is necessary to further extend the film forming region of the etching mask film 3. However, there is a problem that if attempting to extend the film forming region of the etching mask film 3 in consideration of the position of the alignment mark 5 on the mask while using the shielding plate illustrated in FIG. 2 of Patent Document 3, the etching mask film 3 is formed at end surfaces of the substrate 1.

This invention has been made in view of the above problems and has an object to provide a mask blank manufacturing method and a mask blank, that can prevent an etching mask film from being formed at end surfaces of a substrate so as to prevent the occurrence of charge-up and, further, that can extend a film forming region of the etching mask film so as to prevent the occurrence of a lack in an alignment mark.

This invention has the following structures.

(Structure 1) A method of manufacturing a mask blank adapted to be formed with a resist pattern by electron beam writing and having a light-shielding film and an etching mask film of an inorganic-based material resistant to etching of the light-shielding film which are formed in this order on a transparent substrate, wherein, when forming the etching mask film, shielding is performed using a shielding plate so as to prevent the etching mask film from being formed at least at a side surface of the substrate.

Herein, it is noted that Structure 1 may correspond to features recited in claim 1. According to the invention of Structure 1, when forming the etching mask film, the shielding is performed using the shielding plate so as to prevent the etching mask film from being formed at least at the side surface of the substrate. Therefore, there is obtained the mask blank in which the etching mask film is not present at least at the side surface of the substrate. With this mask blank, since the light-shielding film is exposed at the side surface of the substrate, the mask blank can be efficiently grounded at the side surface of the substrate during the EB writing so that it is possible to prevent charge-up of the mask blank and thus to reduce the influence on the resolution of a resist.

(Structure 4) A mask blank adapted to be formed with a resist pattern by electron beam writing and having a light-shielding film and an etching mask film of an inorganic-based material resistant to etching of the light-shielding film which are formed in this order on a transparent substrate, wherein the light-shielding film is made of a material being conductive so that the light-shielding film is not charged up during patterning by electron beam writing, and the etching mask film is not present at least at a side surface of the substrate.

Herein, it is noted that Structure 4 may correspond to features recited in claim 4. According to the invention of Structure 4, there is obtained the mask blank in which the etching mask film is not present at least at the side surface of the substrate. With this mask blank, since the light-shielding film is exposed at the side surface of the substrate, the mask blank can be efficiently grounded at the side surface of the substrate during the EB writing so that it is possible to prevent charge-up of the mask blank and thus to reduce the influence on the resolution of a resist.

(Structure 2) In the above-mentioned Structures, a film forming region of the etching mask film is at least inside the side surface of the substrate and outside an alignment mark so as to prevent occurrence of a lack in the alignment mark.

Herein, it is noted that Structure 2 may correspond to features recited in claim 2. With this structure, in addition to the operation and effect of the above-mentioned Structures, it is possible to extend the film forming region of the etching mask film without forming the etching mask film at the end surface (side surface or chamfered surface) of the substrate. Therefore, in addition to preventing charge-up of the etching mask film, it is also possible to securely form an alignment mark since the film forming region of the etching mask film can be extended.

In this invention, when a portion for grounding the mask blank on a stage of an EB writing apparatus is a chamfered surface of the substrate, it is preferable to extend the film forming region of the etching mask film to the position of a line B' parallel to an outermost side B of a main surface of the substrate 1 and offset inward from the side B by a predetermined distance (see FIG. 1). It is preferable that the distance between B and B' be 2 mm or less for securely forming the alignment mark.

In this invention, when a portion for grounding the mask blank on a stage of an EB writing apparatus is a side surface of the substrate, it is possible to extend the film forming region of the etching mask film to the position of a line A' parallel to a side surface A of the substrate 1 and offset inward from the side surface A by a predetermined distance (see FIG. 1). It is preferable that the distance between A and A' be 1 mm or less for securely forming the alignment mark.

In this invention, as illustrated in FIG. 1, it is most preferable that the film forming region of the etching mask film be extended to the outermost side B of the main surface (i.e. an end B of the main surface or an intersection line B between the main surface and the chamfered surface) of the substrate 1. This mode is preferable because it is possible to form the alignment mark more securely as compared with the case where the film forming region of the etching mask film is narrower than this mode. According to this mode, since the etching mask film is not formed at either the side surface or the chamfered surface of the substrate, grounding can be performed at either of the side surface and the chamfered surface of the substrate and thus it is possible to provide the mask blank that is applicable to writing apparatuses regardless of the type of grounding thereof.

(Structure 3) In the above-mentioned Structures, the shielding plate is made of an elastic material and is brought into contact with or into close vicinity to the substrate so that the shielding is performed.

Herein, it is noted that Structure 3 may correspond to features recited in claim 3. With this structure, it is possible to extend the film forming region of the etching mask film without forming the etching mask film at the end surface (side surface or chamfered surface) of the substrate.

In this invention, as the elastic material, a rubber material, a fluorine-based resin (e.g. Teflon (registered trademark)), or the like can be suitably used.

In this invention, for example, the shielding plate is a sheet (plate-like member) made of a rubber material and having an opening with the same area as that of the main surface of the substrate and is pressed against the substrate so as to be brought into contact with or into adhesion to the substrate, thereby achieving the shielding. The opening of the shielding plate may be increased or reduced in size or changed in shape. Further, it is possible to perform the shielding by bringing the shielding plate into close vicinity to the substrate with a slight gap therebetween.

In this invention, it may be configured that, for example, the shielding plate is brought into contact with the side surface and the chamfered surface of the substrate or into close vicinity to them with a slight gap therebetween to thereby shield those portions while the end B of the main surface is not shielded by the shielding plate (see FIG. 3).

(Structure 5) A method of manufacturing a transfer mask, comprising:

forming an electron beam writing resist layer on the etching mask film in the above-mentioned mask blank;

applying electron beam writing and development to the electron beam writing resist layer to form the resist pattern;

etching the etching mask film using the resist pattern as a mask to transfer the resist pattern onto the etching mask film, thereby forming a pattern of the etching mask film; and etching the light-shielding film using the resist pattern and the pattern of the etching mask film as a mask or using the pattern of the etching mask film as a mask to transfer the pattern onto the light-shielding film, thereby forming a pattern of the light-shielding film.

Herein, it is noted that Structure 5 may correspond to features recited in claim 5. According to the invention of Structure 5, since use is made of the mask blank in which the etching mask film is not present at the side surface or the chamfered surface of the substrate, i.e. the mask blank in which the light-shielding film is exposed at the side surface or the chamfered surface of the substrate, the mask blank can be efficiently grounded at the side surface or the chamfered surface of the substrate during the EB writing so that it is possible to prevent charge-up of the mask blank and thus to reduce the influence on the resolution of the resist.

According to this invention, by performing the shielding so as to prevent the etching mask film from being formed at the side surface or the chamfered surface of the substrate, the light-shielding film is exposed there. Consequently, the mask blank can be efficiently grounded during the EB writing so that it is possible to prevent charge-up of the mask blank and thus to reduce the influence on the resolution of the resist. In addition thereto, it is possible to extend the film forming region of the etching mask film without forming the etching mask film at the end surface of the substrate. Therefore, in addition to preventing charge-up of the etching mask film, it is also possible to securely form the alignment mark since the film forming region of the etching mask film can be extended.

DESCRIPTION OF THE EXEMPLARY EMBODIMENT

Hereinbelow, an embodiment according to this invention will be described with reference to the drawings.

Figure 1:
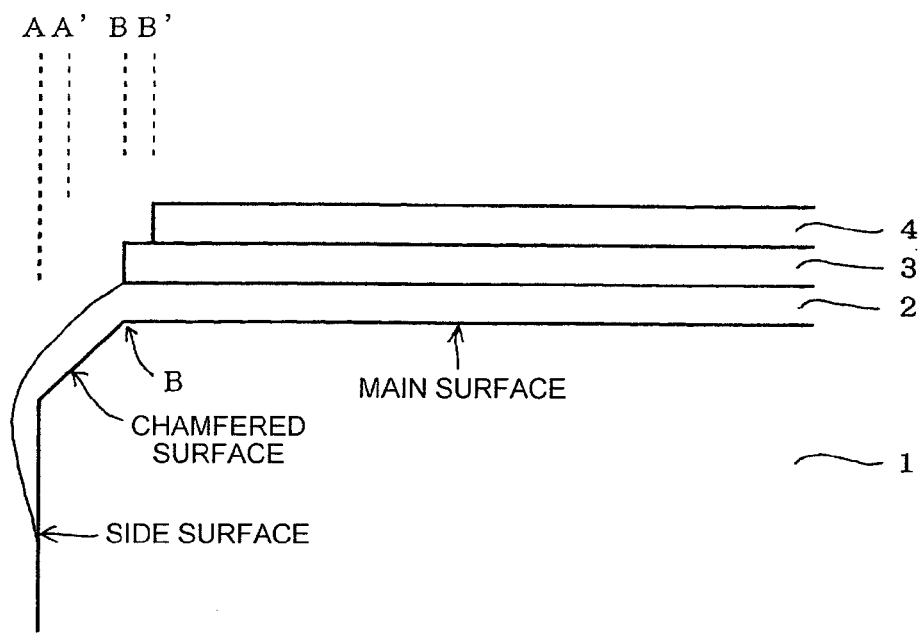
FIG. 1 is a partial sectional view illustrating one example of a mask blank according to this invention.

FIG. 1 illustrates one example of a mask blank according to the embodiment of this invention. In this example, the mask blank is a binary mask blank and comprises a transparent substrate 1, a light-shielding film 2, an etching mask film 3, and a resist film 4 in this order.

As the light-shielding film 2, use can be made of a metal film containing a metal. As the metal film containing the metal, there is cited a film made of chromium, tantalum, molybdenum, titanium, hafnium, tungsten, any of alloys containing those elements, or any of materials containing those elements or those alloys (e.g. a film containing at least one of oxygen, nitrogen, silicon, and carbon in addition to any of the materials containing those elements or those alloys).

As the light-shielding film 2, use can be made of, for example, a film made of chromium alone or a material containing chromium and at least one element selected from oxygen, nitrogen, carbon, and hydrogen (Cr-containing material). The light-shielding film 2 may have a film structure composed of a single layer or a plurality of layers made of the above film material. With different compositions, the light-shielding film 2 may have a film structure in which a plurality of layers are formed stepwise or a film structure in which the composition continuously changes.

The specific light-shielding film 2 is a laminated film composed of a light-shielding layer in the form of a chromium nitride film (CrN film) and a chromium carbonitride film (CrCN film) and an antireflection layer in the form of a film containing chromium, oxygen, and nitrogen (CrON film). The chromium nitride film is a layer mainly containing chromium nitride (CrN) and has a thickness of, for example, 10 to 20 nm. The chromium carbonitride film is a layer mainly containing chromium carbonitride (CrCN) and has a thickness of, for example, 25 to 60 nm. The film containing chromium, oxygen, and nitrogen (CrON film) has a thickness of, for example, 15 to 30 nm.

In this invention, as the light-shielding film 2, it is preferable to use a material being conductive so that it is not charged up during patterning by electron beam writing.

In this invention, as illustrated in FIG. 1, the light-shielding film 2 is formed from a main surface of the substrate 1 down to side surfaces or chamfered surfaces of the substrate 1.

As the etching mask film 3, use can be made of, for example, a silicon-containing film containing silicon. As the silicon-containing film, there is cited a silicon film, a metal silicide film containing silicon and a metal such as chromium, tantalum, molybdenum, titanium, hafnium, or tungsten, or a film containing at least one of oxygen, nitrogen, and carbon in the silicon film or the metal silicide film. As the etching mask film 3, use can be made of, for example, a film mainly containing a transition metal silicide oxide, a transition metal silicide nitride, a transition metal silicide oxynitride, a transition metal silicide oxycarbide, a transition metal silicide nitride carbide, or a transition metal silicide oxynitride carbide. As the etching mask film 3, use can be made of, for example, a molybdenum-based (MoSiON, MoSiN, MoSiO, or the like) film, a tungsten-based (WSiON, WSiN, WSiO, or the like) film, a silicon-based (SiN, SiON, or the like) film, or a chromium-based (CrO, CrF, or the like) film. For example, the etching mask film 3 is preferably made of MoSiN or SiON.

In this invention, as illustrated in FIG. 1, it is most preferable that the film forming region of the etching mask film 3 be extended to outermost sides B of the main surface (i.e. ends B of the main surface or intersection lines B between the main surface and the chamfered surfaces) of the substrate 1.

In this invention, a photomask blank, a phase shift mask blank, a reflective mask blank, and an in-print transfer plate substrate are also included in mask blanks. Further, a mask blank with a resist film and a mask blank before formation of a resist film are included in mask blanks. A phase shift mask blank may have a structure in which a light-shielding film of a chromium-based material or the like is formed on a halftone film. A reflective mask blank may have a structure in which an absorbent film of a tantalum-based material or a chromium-based material to be a transfer pattern is formed on a multilayer reflective film or a buffer layer provided on a multilayer reflective film. An in-print transfer plate may have a structure in which a thin film for transfer pattern formation of a chromium-based material or the like is formed on a base member that serves as a transfer plate.

In this invention, a mask blank, in which a thin film for transfer pattern formation and an etching mask film of an inorganic-based material resistant to etching of the thin film for transfer pattern formation are formed in this order on a transparent substrate, is included in mask blanks. In this case, the thin film for transfer pattern formation is made of a material being conductive so that it is not charged up during patterning by electron beam writing. The contents described above are also applicable by replacing a "light-shielding film" with a "thin film for transfer pattern formation".

In this invention, a photomask, a phase shift mask, a reflective mask, and an in-print transfer plate are included in masks. A reticle is included in masks. A phase shift mask may have a structure in which a phase shifter is formed by etching a substrate.

In this invention, as a substrate, there is cited a synthetic quartz substrate, a soda-lime glass substrate, an alkali-free glass substrate, a low thermal expansion glass substrate, or the like.

In this invention, it is preferable to use a dry etching gas such as a chlorine-based gas or a mixed gas containing a chlorine-based gas and an oxygen gas in dry etching of a chromium-based thin film. This is because, by performing dry etching of a chromium-based thin film, made of a material containing chromium and an element such as oxygen or nitrogen, using the above dry etching gas, it is possible to increase the dry etching rate and thus to shorten the dry etching time to thereby form a light-shielding film pattern with an excellent sectional shape. As the chlorine-based gas for use as or in the dry etching gas, there is cited, for example, $Cl_2$, $SiCl_4$, HCl, $CCl_4$, or $CHCl_3$.

In this invention, in dry etching of a silicon-containing film containing silicon or a metal silicide-based thin film, use can be made of, for example, a fluorine-based gas such as $SF_6$, $CF_4$, $C_2F_6$, or $CHF_3$, or a mixed gas thereof with He, $H_2$, $N_2$, Ar, $C_2H_4$, or $O_2$, or a chlorine-based gas such as $Cl_2$ or $CH_2Cl_2$, or a mixed gas thereof with He, $H_2$, $N_2$, Ar, or $C_2H_4$.

In this invention, as a phase shift film, use can be made of, for example, a silicon-containing film containing silicon. As the silicon-containing film, there is cited a silicon film, a metal silicide film containing silicon and a metal such as chromium, tantalum, molybdenum, titanium, hafnium, or tungsten, or a film containing at least one of oxygen, nitrogen, and carbon in the silicon film or the metal silicide film. As a phase shift film, use can be made of, for example, a film mainly containing a transition metal silicide oxide, a transition metal silicide nitride, a transition metal silicide oxynitride, a transition metal silicide oxycarbide, a transition metal silicide nitride carbide, or a transition metal silicide oxynitride carbide. As a phase shift film, use can be made of, for example, a molybdenum-based (MoSiON, MoSiN, MoSiO, or the like) halftone film, a tungsten-based (WSiON, WSiN, WSiO, or the like) halftone film, a silicon-based (SiN, SiON, or the like) halftone film, or a chromium-based (CrO, CrF, or the like) halftone film.

As a phase shift film, use can be made of, for example, a halftone film composed of two layers, i.e. a phase adjusting layer for mainly controlling the phase of exposure light and a transmittance adjusting layer for mainly controlling the transmittance of exposure light.

Hereinbelow, Examples of this invention and Comparative Examples thereof will be shown.

Example 1 and Comparative Examples 1 and 2

Manufacture of Mask Blank

Figure 2:
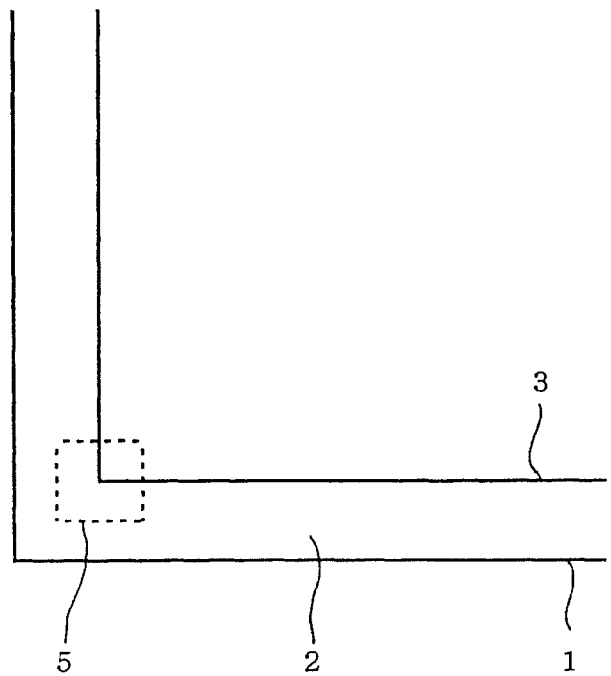
FIG. 2 is a partial plan view for explaining a problem of a lack in an alignment mark.
Figure 3:
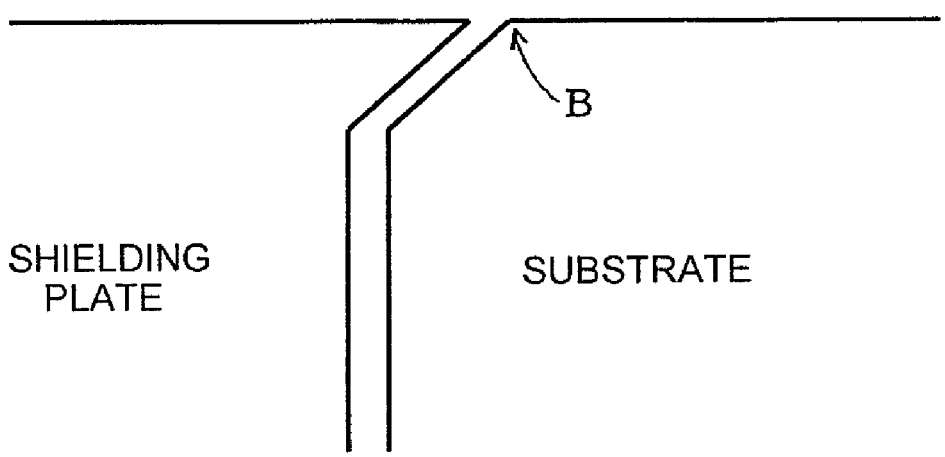
FIG. 3 is a partial sectional view for explaining one mode of a shielding plate according to this invention.

Referring to FIG. 2, a description will be given of a photomask manufacturing method according to Example 1 of this invention.

At first, a substrate made of quartz was mirror-polished and then cleaned, thereby obtaining a light-transmissive substrate 1 of 6 inches×6 inches×0.25 inches.

Then, using an in-line sputtering apparatus where a plurality of chromium (Cr) targets were disposed in the same chamber, a light-shielding chromium film 2 composed of a CrN film, a CrC film, and a CrON film was formed on the light-transmissive substrate 1. Specifically, at first, reactive sputtering was carried out in a mixed gas atmosphere of argon (Ar) and nitrogen ($N_2$) (Ar:$N_2$=72:28 [vol %]; pressure: 0.3 [Pa]), thereby forming the CrN film having a thickness of 15 [nm]. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming the CrC film having a thickness of 20 [nm] on the CrN film. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming the CrON film having a thickness of 20 [nm] on the CrC film. The above CrN film, CrC film, and CrON film were continuously formed using the in-line sputtering apparatus and thus the light-shielding chromium film 2 containing these CrN, CrC, and CrON was configured such that these components continuously changed in a thickness direction thereof.

Then, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based inorganic-based etching mask film 3 having a thickness of 20 [nm] on the light-shielding chromium film 2.

In this event, in Example 1, the etching mask film 3 was formed by tightly pressing a sheet (plate-like member), made of a silicon rubber material and having an opening with the same area as that of the main surface of the substrate 1, against the substrate 1 to shield the side surfaces and the chamfered surfaces of the substrate 1. This made it possible to extend the film forming region of the etching mask film 3 to the outermost sides B of the main surface of the substrate 1 as illustrated in FIG. 1.

On the other hand, in each of Comparative Examples 1 and 2, the etching mask film 3 was formed using the shielding plate illustrated in FIG. 2 of Patent Document 3. However, when attempting to extend the film forming region of the etching mask film in consideration of the position of an alignment mark on a mask, the etching mask film was formed at the side surfaces or the chamfered surfaces of the substrate (Comparative Example 1). Further, when attempting not to form the etching mask film at the side surfaces or the chamfered surfaces of the substrate, the film forming region of the etching mask film was narrowed (e.g. to the inside of B') (Comparative Example 2).

Then, a chemically amplified positive resist 4 for electron beam writing (exposure) (FEP171: manufactured by FUJIFILM Electronic Materials Co., Ltd.) was spin-coated to a thickness of 200 [nm] on the inorganic-based etching mask film 3 (see FIG. 1).

In this manner, there was prepared a mask blank in which the light-shielding chromium film 2 of the Cr-based materials, the inorganic-based etching mask film 3 of the MoSiN-based material, and the resist 4 were formed in this order on the light-transmissive substrate 1.

The sheet resistance was measured for the sample at the stage where the light-shielding chromium film 2 was formed, and it was 120 $\Omega$/square.

Further, the sheet resistance was measured for the sample at the stage where the etching mask film 3 was formed, and it was 170 $\Omega$/square.

(Manufacture of Mask)

Then, the resist 4 was subjected to electron beam writing by the use of JBX9000 manufactured by JEOL Ltd. and then was developed, thereby forming a resist pattern. In this event, in each of Example 1 and Comparative Examples 1 and 2, the mask blank was grounded at its side surface or chamfered surface on a stage of an EB writing apparatus.

Then, using the resist pattern as a mask, dry etching mainly with ionicity was carried out at a pressure of 5 [mmtorr] using a mixed gas of $SF_6$ and He to etch the inorganic-based etching mask film 3, thereby forming an inorganic-based etching mask pattern.

Then, the resist pattern was removed. Thereafter, using only the inorganic-based etching mask pattern as a mask, dry etching mainly with radicals where ionicity was increased as much as possible (=ionicity was increased to a level where ions and radicals became approximately equal to each other) was carried out at a pressure of 3 mmTorr using a mixed gas of $Cl_2$ and $O_2$ to etch the light-shielding chromium film 2, thereby forming a light-shielding chromium pattern.

Then, the inorganic-based etching mask pattern was stripped and then cleaning was carried out, thereby obtaining a photomask.

(Evaluation)

The masks thus obtained were evaluated.

As a result, with respect to the mask according to Example 1, no charge-up was observed in the mask manufacturing process and there was observed no reduction in CD accuracy considered to be caused by the charge-up. Accordingly, it was confirmed that it would be possible to accurately process a fine pattern of a hp45 nm mask. Further, an alignment mark (see FIG. 2) was securely formed with no lack.

With respect to the mask according to Comparative Example 1, charge-up was observed in the mask manufacturing process and there was observed a reduction in CD accuracy considered to be caused by the charge-up.

With respect to the mask according to Comparative Example 2, a lack occurred in an alignment mark (see FIG. 2) and thus the alignment mark failed in function.

Example 2

Example 2 was the same as Example 1 except that an inorganic-based etching mask film 3 was made of SiON instead of MoSiN.

The results of the evaluation were the same as those of Example 1.

While this invention has been described based on the embodiment, the technical scope of this invention is not limited thereto. It is readily understood by a person skilled in the art that various modifications or improvements can be added to the foregoing embodiment. It is apparent from the description of the claims that the modes added with those modifications or improvements can also be included in the technical scope of this invention.

What is claimed is:

1. A method of manufacturing a mask blank adapted to be formed with a resist pattern by electron beam writing and having a light-shielding film and an etching mask film of an inorganic-based material resistant to etching of the light-shielding film which are formed in this order on a transparent substrate, wherein, when forming the etching mask film, shielding is performed using a shielding plate so as to prevent the etching mask film from being formed at least at a side surface of the substrate, wherein the light-shielding film is present at least at the side surface of the substrate.

2. The method according to claim 1, wherein a film forming region of the etching mask film is at least inside the side surface of the substrate and outside an alignment mark so as to prevent occurrence of a lack in the alignment mark.

3. The method according to claim 1, wherein the shielding plate is made of an elastic material and is brought into contact with or into close vicinity to the substrate so that the shielding is performed.

4. The method according to claim 1, wherein the mask blank is grounded at the side surface of the substrate through the light-shielding film during the electron beam writing to prevent charge-up of the etching mask film.

5. A mask blank adapted to be formed with a resist pattern by electron beam writing and having a light-shielding film and an etching mask film of an inorganic-based material resistant to etching of the light-shielding film which are formed in this order on a transparent substrate, wherein the light-shielding film is made of a material being conductive so that the light-shielding film is not charged up during patterning by electron beam writing, and the etching mask film is not present at least at a side surface of the substrate, wherein the light-shielding film is present at least at the side surface of the substrate.

6. The mask blank according to claim 5, wherein the mask blank is grounded at the side surface of the substrate through the light-shielding film during the electron beam writing to prevent charge-up of the etching mask film.

7. A method of manufacturing a transfer mask, comprising:

forming an electron beam writing resist layer on the etching mask film in the mask blank according to claim 5;

applying electron beam writing and development to the electron beam writing resist layer to form the resist pattern;

etching the etching mask film using the resist pattern as a mask to transfer the resist pattern onto the etching mask film, thereby forming a pattern of the etching mask film; and etching the light-shielding film using the resist pattern and the pattern of the etching mask film as a mask or using the pattern of the etching mask film as a mask to transfer the pattern onto the light-shielding film, thereby forming a pattern of the light-shielding film.

* * * * *